(12) United States Patent
Dai et al.

(10) Patent No.: US 11,031,284 B2
(45) Date of Patent: Jun. 8, 2021

(54) SEMICONDUCTOR DEVICE AND METHOD OF FORMING THE SAME

(71) Applicant: TAIWAN SEMICONDUCTOR MANUFACTURING COMPANY LTD., Hsinchu (TW)

(72) Inventors: Pin-Ren Dai, New Taipei (TW); Hsi-Wen Tien, Hsinchu County (TW); Wei-Hao Liao, Taichung (TW); Chih Wei Lu, Hsinchu (TW); Chung-Ju Lee, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/902,108

(22) Filed: Jun. 15, 2020

(65) Prior Publication Data

US 2020/0312705 A1    Oct. 1, 2020

Related U.S. Application Data

(63) Continuation of application No. 16/165,525, filed on Oct. 19, 2018, now Pat. No. 10,685,869.

(51) Int. Cl.
    *H01L 21/768*    (2006.01)
    *H01L 23/532*    (2006.01)
    *H01L 23/48*     (2006.01)

(52) U.S. Cl.
    CPC .... *H01L 21/7681* (2013.01); *H01L 21/76834* (2013.01); *H01L 23/481* (2013.01); *H01L 23/53257* (2013.01)

(58) Field of Classification Search
    CPC ........... H01L 21/7681; H01L 23/53257; H01L 21/76834; H01L 23/481
    See application file for complete search history.

(56) References Cited

U.S. PATENT DOCUMENTS

| 6,245,650 | B1 * | 6/2001 | Watanabe | H01L 28/60 257/E21.009 |
| 2004/0082182 | A1 * | 4/2004 | Blosse | H01L 21/76813 438/700 |
| 2015/0206893 | A1 * | 7/2015 | Sun | H01L 21/76834 257/532 |

\* cited by examiner

*Primary Examiner* — Sitaramarao S Yechuri
(74) *Attorney, Agent, or Firm* — WPAT, P.C., Intellectual Property Attorneys; Anthony King

(57) ABSTRACT

The present disclosure provides a semiconductor device. The semiconductor device includes a substrate having a first conductive pattern and a conductive mask disposed over the first conductive pattern. The semiconductor device further includes a second conductive pattern disposed over the conductive mask, and electrically connecting with the first conductive pattern through the conductive mask. The conductive mask has a lower etch rate to a predetermined etchant than the second conductive pattern. A method for forming the semiconductor device is also provided.

20 Claims, 13 Drawing Sheets

SEMICONDUCTOR DEVICE AND METHOD OF FORMING THE SAME

PRIORITY CLAIM AND CROSS-REFERENCE

This patent is a continuation of U.S. patent application Ser. No. 16/165,525 filed on Oct. 19, 2018, entitled of "A SEMICONDUCTOR DEVICE AND METHOD OF FORMING THE SAME", now allowed, which is incorporated by reference in its entirety.

BACKGROUND

In integrated circuit design, a commonly used method for forming metal lines and vias is known as "damascene." Generally, this method involves forming an opening in a dielectric layer. Then the opening is filled with metal or metal alloys. Excess metal on the surface of the dielectric layer is then removed by a chemical mechanical polish (CMP). The remaining metal forms vias and/or metal lines.

While aluminum and aluminum alloys were most frequently used in the past, the current trend is to use copper (Cu) in the damascene structures because of its low resistivity. Typically, copper is electro-plated into damascene openings.

As semiconductor technologies further advance, accurate alignment or overlay may become problematic due to the ever-decreasing sizes of the vias and metal lines. For example, it may be more difficult for vias to be accurately aligned with the desired metal lines above or below. When misalignment or overlay problems occur, conventional methods of fabrication may lead to undesirable over-etching of the below m. It is within this context the following disclosure arises.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
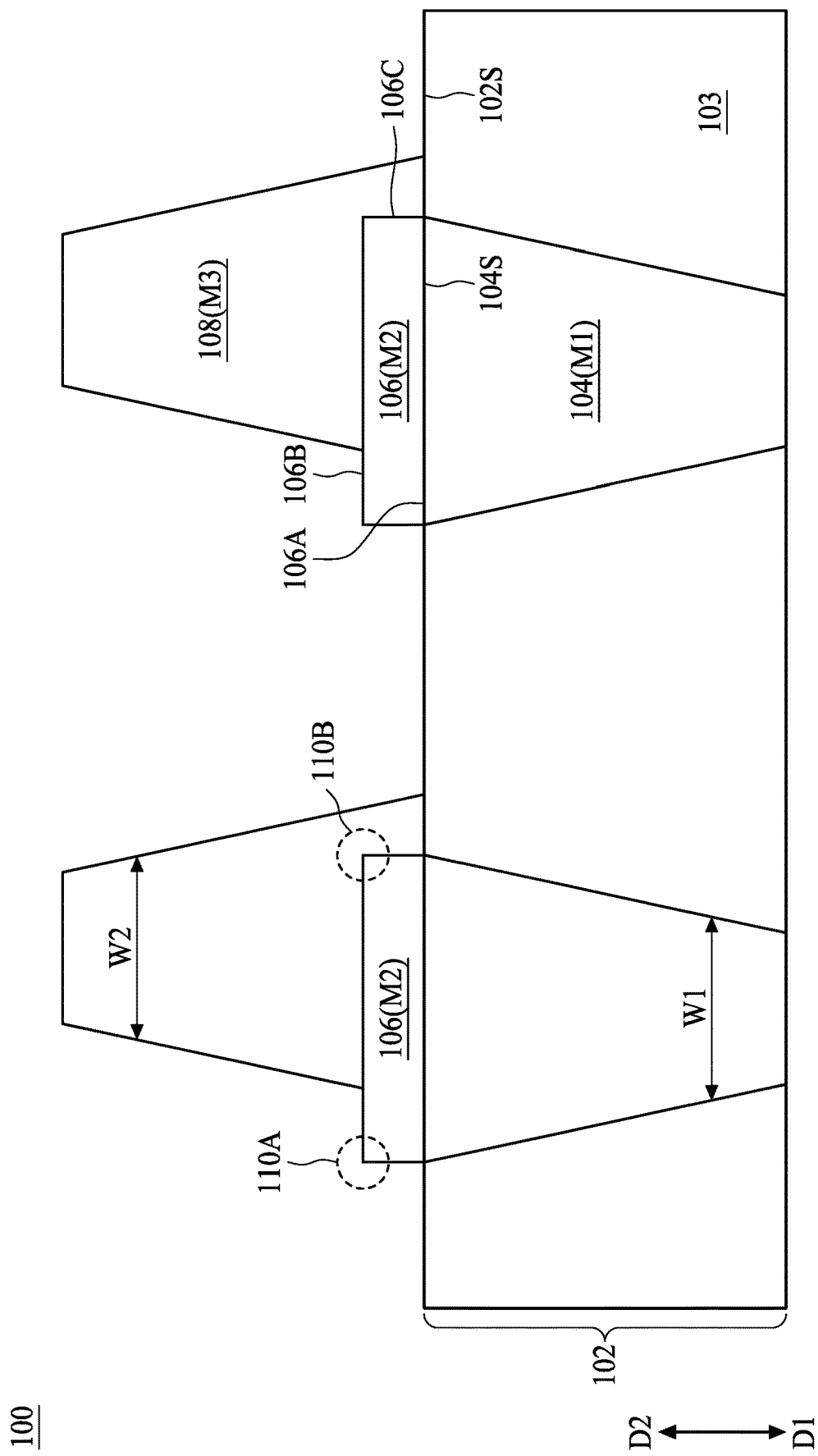
FIG. 1 is a cross section view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Semiconductor devices and methods of forming the same are provided. In particular, semiconductor devices with a mask for protecting underlying metal are described in greater detail below. In addition, methods of forming semiconductor devices with a mask for protecting underlying metal are also provided below. Other features and processes may also be included.

Referring to FIG. 1, FIG. 1 is a cross section view of a semiconductor device 100 in accordance with some embodiments of the present disclosure.

The semiconductor device 100 includes a substrate 102 having a first conductive pattern 104. The semiconductor device 100 also includes a conductive mask 106 disposed over the first conductive pattern 104, and a second conductive pattern 108 disposed over the conductive mask 106.

The first conductive pattern 104 includes a first conductive material M1. In some embodiments, the first conductive material M1 may be disposed in a via hole or a via opening of the substrate 102 to form a via and conductive line. In various examples, the first conductive material M1 may be copper (Cu). In some embodiments, the first conductive material M1 may be a copper alloy, silver (Ag), gold (Au), tungsten (W), tantalum (Ta), aluminum (Al), and the like.

In some embodiments, the first conductive pattern 104 may be formed by a damascene operation, such as a single-damascene operation or a double-damascene operation. A damascene operation which creates either only trenches or vias is known as a single damascene operation. A damascene operation which creates both trenches and vias at the same time is known as a dual-damascene operation. The dual-damascene operation may be the via first trench last (VFTL) approach or the trench first via last (TFVL) approach.

The conductive mask 106 includes a second conductive material M2. In some embodiments, the conductive mask 106 served as an etch stop layer. In addition to signaling the termination point of an etching operation, the conductive mask 106 protects the underlying first conductive pattern 104 during the etching operation.

In various examples, the second conductive material M2 includes cobalt (Co), nickel (Ni), or other suitable material that may protect the first conductive material M1 during the etching operation.

In some embodiments, the second conductive pattern 108 may be formed by performing an etching operation to a blanket metal layer with the predetermined etchant. In some embodiments, the predetermined etchant includes halogens. For example, the etch recipe may include a plasma etch gas having $Cl_2$, $BCl_3$, $CF_4$, $CH_2F_2$, and/or $C_4F_8$. In some embodiments, the etch recipe may also include $H_2$, $N_2$, and/or $O_2$. It should be noted that the etch recipe shown above is for illustration only, and any other etch recipe can be used for any other vias and metal lines. The second conductive pattern 108 includes a third conductive material M3. The second conductive material M2 has a lower etch rate to a predetermined etchant than the third conductive material M3 of the second conductive pattern 108.

In some embodiments, the first conductive pattern 104 and the second conductive pattern 108 are formed by different operation. The first conductive pattern 104 is formed by a damascene operation, which includes etching an insulative layer (such as a dielectric layer) to form a via hole, and filling the via hole with a conductive material (such as copper). The second conductive pattern 108 is formed by etching a blanket conductive layer to form a via and/or a metal line, and then performing a dielectric gap filling operation to embed the via and/or metal line. The dielectric embedding the second conductive pattern 108 is not shown in the figures.

The second conductive pattern 108 electrically connects with the first conductive pattern 104 through the conductive mask 106. In some embodiments, the second conductive pattern 108 covers up the conductive mask 106.

In some embodiments, the conductive mask 106 includes two corners 110A and 110B as shown in the cross-sectional view in FIG. 1. In some embodiments, the second conductive pattern 108 covers up at least one of the two corners 110A and 110B. In some embodiments, the second conductive pattern 108 covers up the corner 110B, while the corner 110A is free from the second conductive pattern 108.

In some embodiments, from the cross-sectional view, the conductive mask 106 includes a first surface 106A contacting with the first conductive pattern 104. The conductive mask 106 also includes a second surface 106B contacting with the second conductive pattern 108. Besides, the conductive mask 106 also includes two sidewall surfaces 106C connected between the first surface 106A and the second surface 106B. In some embodiments, the sidewall surfaces 106C are embedded in the second conductive pattern 108. In some embodiments, at least one of the sidewall surfaces 106C is embedded in the second conductive pattern 108.

In some embodiments, the substrate 102 further includes a dielectric material 103, and the first conductive pattern 104 is embedded in the dielectric material 103. In some embodiments, a surface 104S of the first conductive pattern 104 is exposed from the dielectric material 103. In some embodiments, the whole dielectric material 103 of the substrate 102 is free from the conductive mask 106.

In some embodiments, the substrate 102 has a dielectric surface 102S coplanar with the surface 104S of the first conductive pattern 104. In some embodiments, the conductive mask 106 covers up the surface 104S of the first conductive pattern 104, while the dielectric surface 102S is free from the conductive mask 106. In some embodiments, the whole dielectric surface 102S is free from the conductive mask 106.

In some embodiments, the first conductive pattern 104 has a first width W1 that gradually changed. The second conductive pattern 108 has a second width W2 that gradually changed. In some embodiments, the first width W1 and the second width W2 are measured in a direction which is perpendicular to the direction along which the conductive mask 106 stacks on the first conductive pattern 104. In some embodiments, the first width W1 and the second width W2 are gradually changed along the stacking direction. In some embodiments, the first width W1 of the first conductive pattern 104 and the second width W2 of the second conductive pattern 108 are gradually increase toward each other.

In some embodiments, the first conductive pattern 104 tapers toward a first direction D1. In other words, the first conductive pattern 104 has a tapered profile with one end closer to the conductive mask 106 being wider than the another end that farther from the conductive mask 106.

In some embodiments, the first width W1 tapers inwardly from the side contacting the conductive mask 106 to the opposite side. In some embodiments, the first width W1 tapers by a varied slope. In some embodiments, the first width W1 tapers by a constant slope.

In some embodiments, the second conductive pattern 108 tapers toward a second direction D2 that opposite to the first direction D1. The second conductive pattern 108 has a tapered profile with one end closer to the conductive mask 106 being wider than the another end that farther from the conductive mask 106, which is similar to the first conductive pattern 104.

In some embodiments, the second width W2 tapers inwardly from the side contacting the conductive mask 106 to the opposite side. In some embodiments, the second width W2 tapers by a varied slope. In some embodiments, the second width W2 tapers by a constant slope.

Figure 2:
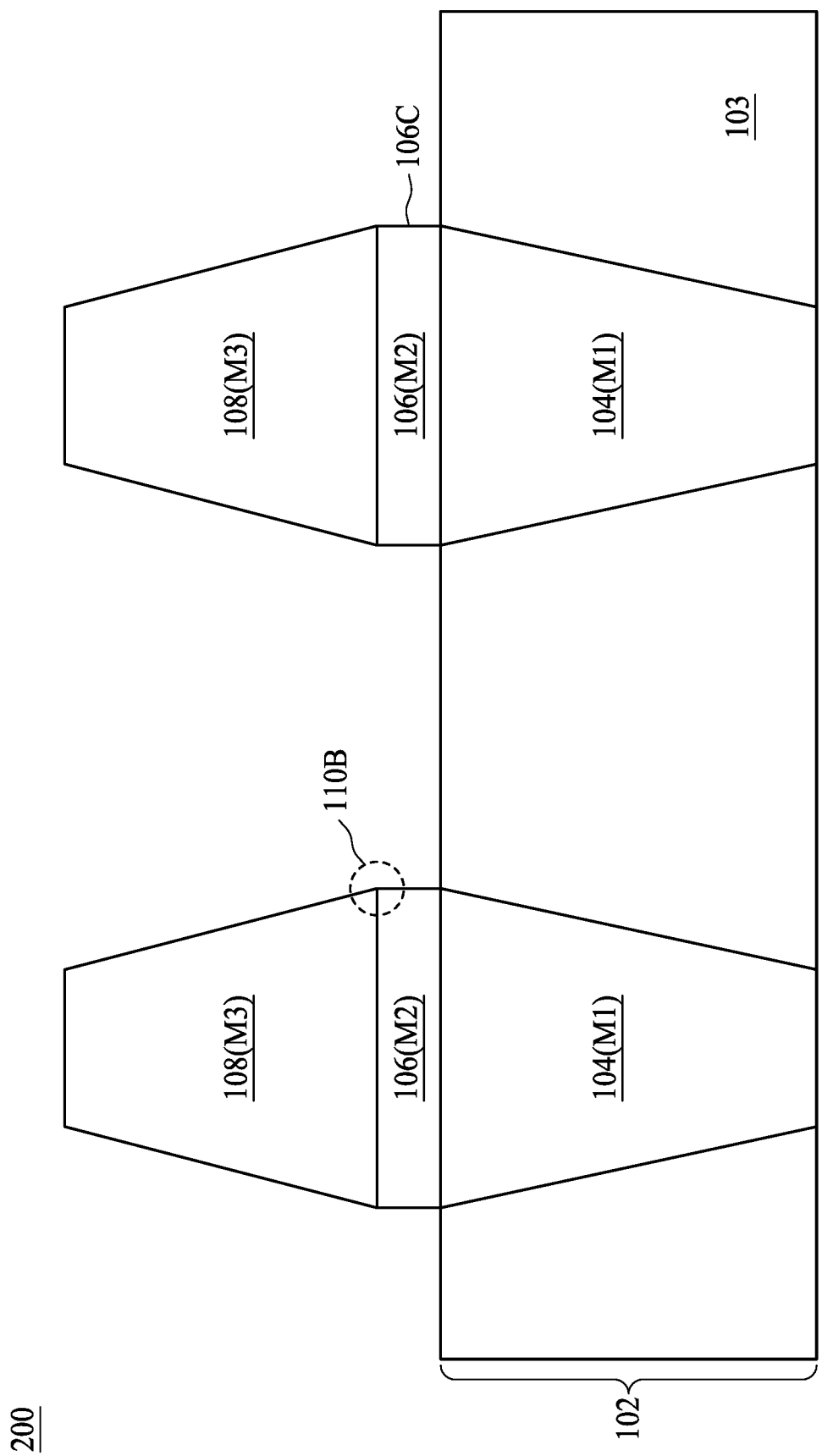
FIG. 2 is a cross section view of a semiconductor device in accordance with some embodiments of the present disclosure.

Referring to FIG. 2, FIG. 2 is a cross section view of a semiconductor device 200 in accordance with some embodiments of the present disclosure. Since the semiconductor device 200 in FIG. 2 is similar to the semiconductor device 100 in FIG. 1, the identical numbers represent similar components for simplicity of explanation. Such similar components are omitted in the interest of brevity, and only the differences are provided.

The semiconductor device 200 is similar to the semiconductor device 100 with the difference that the second conductive pattern 108 is aligned with the conductive mask 106. In some embodiments, the corners of the conductive mask 106 are partially covered by the second conductive pattern 108. In some embodiments, the sidewall surfaces 106C are free from the second conductive pattern 108.

Referring to FIG. 3 to FIG. 13, FIG. 3 to FIG. 13 illustrate a method of forming a semiconductor device in accordance with some embodiments of the present disclosure.

Figure 7:
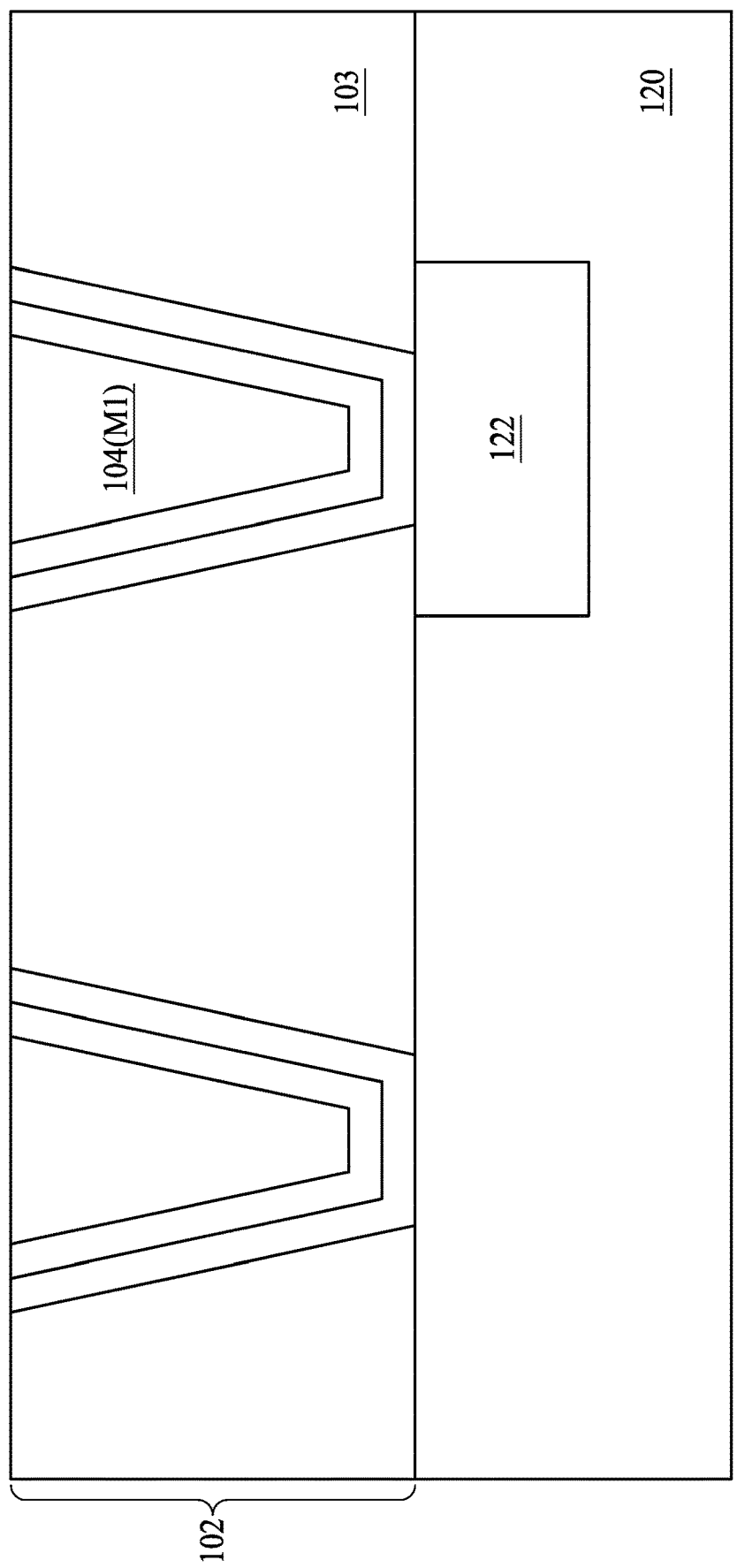
Figure 8:
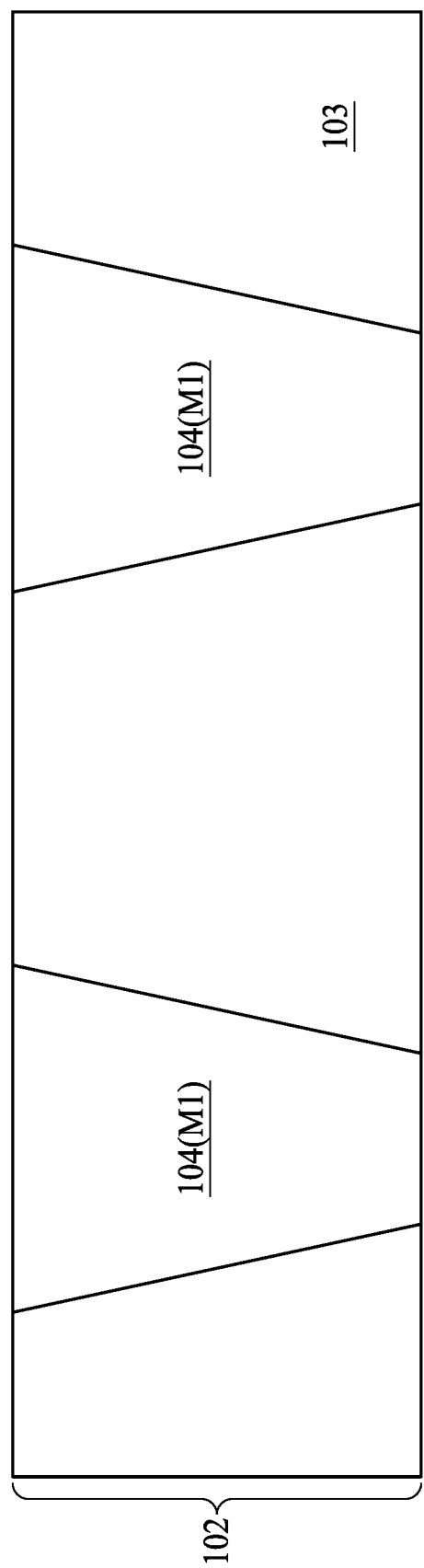

The method begins with FIG. 8, forming the substrate 102. Before addressing illustrated embodiments of the method specifically, exemplary embodiments of forming the substrate 102 through a damascene operation are discussed with reference to FIG. 3 to FIG. 7.

Figure 3:
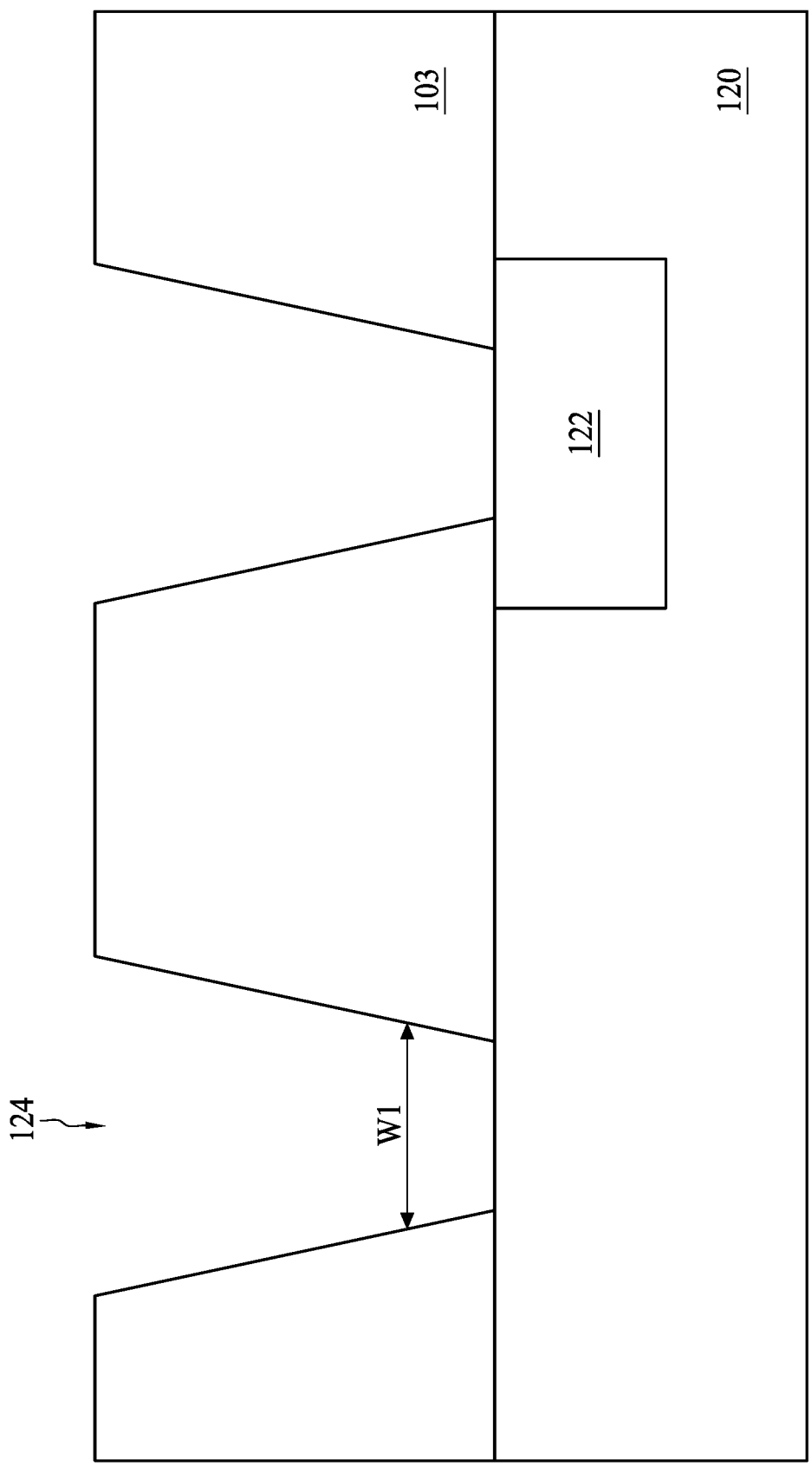
FIG. 3 to FIG. 13 illustrate a method of forming a semiconductor device in accordance with some embodiments of the present disclosure.

FIG. 3 illustrates a cross-sectional view of a semiconductor device according to an embodiment of the present disclosure. The semiconductor device of FIG. 3 includes individual devices 122, such as transistors, formed on a bottom layer 120. The bottom layer 120 is a substrate layer where a plurality of drain and source regions of the transistors may be formed. Generally, the individual devices 122 get interconnected with wiring or metallization layers over the bottom layer 120 through the damascene operation.

In various examples, the bottom layer 120 may include bulk silicon, doped or undoped, or an active layer of a semiconductor-on-insulator (SOI) substrate. Generally, an SOI substrate includes a layer of a semiconductor material, such as silicon, formed on an insulator layer. The insulator layer may be a buried oxide (BOX) layer or a silicon oxide layer. Other substrates known in the art may also be used.

The individual devices 122 may include a gate structure. The gate structure may be a planar or three dimension (such as FinFET) gate. Various materials can be chosen for the gate structure, such as metal, polysilicon, metal alloy, or other suitable materials.

In some embodiments, the bottom layer 120 may include p-type and/or n-type doped regions of electrical devices, such as N-type metal-oxide semiconductor (NMOS) devices and/or P-type metal-oxide semiconductor (PMOS) devices. The N/P-type devices may include transistors, capacitors, resistors, diodes, photo-diodes, fuses, and the like, interconnected to perform one or more functions. The functions may include memory structures, processing structures, sensors, amplifiers, power distribution, input/output circuitry, or the like.

The dielectric material 103 is formed on the bottom layer 120 as an insulating layer, i.e., an inter-layer dielectric (ILD) layer.

The dielectric material 103 may include a low dielectric constant (k value) material or an extra low dielectric constant (ELK) material. Generally, a low-k dielectric material has a dielectric constant of less than about 3.5, and an ELK dielectric material has a dielectric constant of less than about 2.8. For example, the dielectric material 103 may include silicon dioxide ($SiO_2$), carbon-doped silicon dioxide, porous silicon dioxide, horophosphosilicate glass (BPSG), tetraethyl orthosilicate (TEOS), spin-on glass (SOG), undoped silicate glass (USG), fluorinated silicate glass (FSG), high-density plasma (FIDP) oxide, or plasma-enhanced TEOS (PETEOS). A planarization operation, such as chemical-mechanical polishing (CMP), may be performed to planarize the dielectric material 103.

In some embodiments, the dielectric material 103 may be a composite film. For example, the composite film may include an etching stop layer, a low-k or extra low-k (ELK) dielectric layer, an anti-reflective coating (ARC) layer, and a metal-hard-mask (MHM) layer.

In some embodiments, the dielectric material 103 can be deposited by chemical vapor deposition (CVD), plasma enhanced chemical vapor deposition (PECVD), high density plasma chemical vapor deposition (HDP-CVD) atmospheric pressure chemical vapor deposition (APCVD), or other suitable operation known in the art.

To form via holes 124 in the dielectric material 103, a photoresist layer may be defined on the dielectric material 103. The photoresist layer is required to be patterned based on the desired layout configuration of vias and metal lines in the dielectric material 103.

The photoresist layer may include adhesive agents, sensitizers and solvents. It may be a positive or a negative resist. The photoresist layer may be formed by spin on methods on a rotating chuck. The photoresist layer may then be etched to transfer the pattern into the dielectric material 103.

The underlying individual devices 122 or bottom layer 120 may be exposed through the via holes 124. Though two via holes 124 are shown in the figures, the numbers are for explanation purpose only, and the present disclosure is not limited thereto.

The via holes 124 in the dielectric material 103 is intentionally configured to have a tapered profile. As the critical dimensions (CD) of vias or metal lines to be formed in the dielectric material 103 become smaller, in physical vapor deposition (PVD), CVD, or atomic layer deposition (ALD), barrier or copper seed layer may preferentially deposit near the top corners of the via holes, and leading to a "bottleneck" shape, i.e. necking effect. By forming the via holes 124 with a tapered profile, the above issue can be mitigated.

Figure 4:
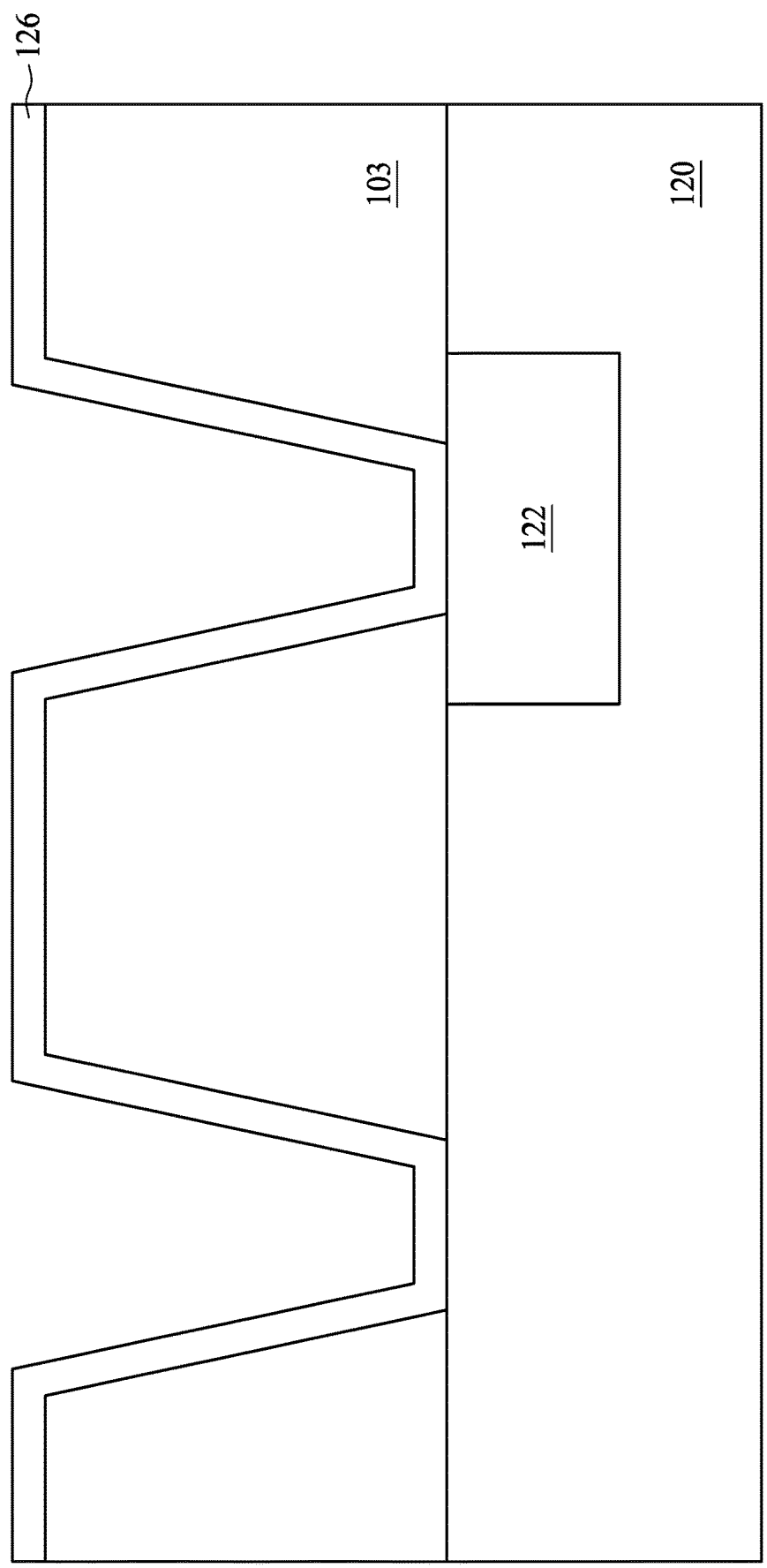

Referring to FIG. 4, in some embodiments, a barrier layer 126 may be deposited in the via holes 124. The barrier layer 126 covers the sidewalls and the bottom of the via holes 124. The barrier layer 126 may be formed by CVD, PVD, PECVD, plasma enhanced PVD (PEPVD), ALD, combinations of these, or the like. The barrier layer 126 may include tantalum nitride (TaN), although other materials, such as tantalum (Ta), titanium (Ti), titanium nitride (TiN), combinations of these, and the like may alternatively be used. The barrier layer 126 is used to prevent copper diffusion in the dielectric material 103. The excess portions formed around the top corners of the via holes 124 are often referred to as overhangs. In this embodiment, by enlarging the top opening and forming the tapered profile, the subsequent copper filling operation is not greatly affected by the necking effect induced from overhangs.

Figure 5:
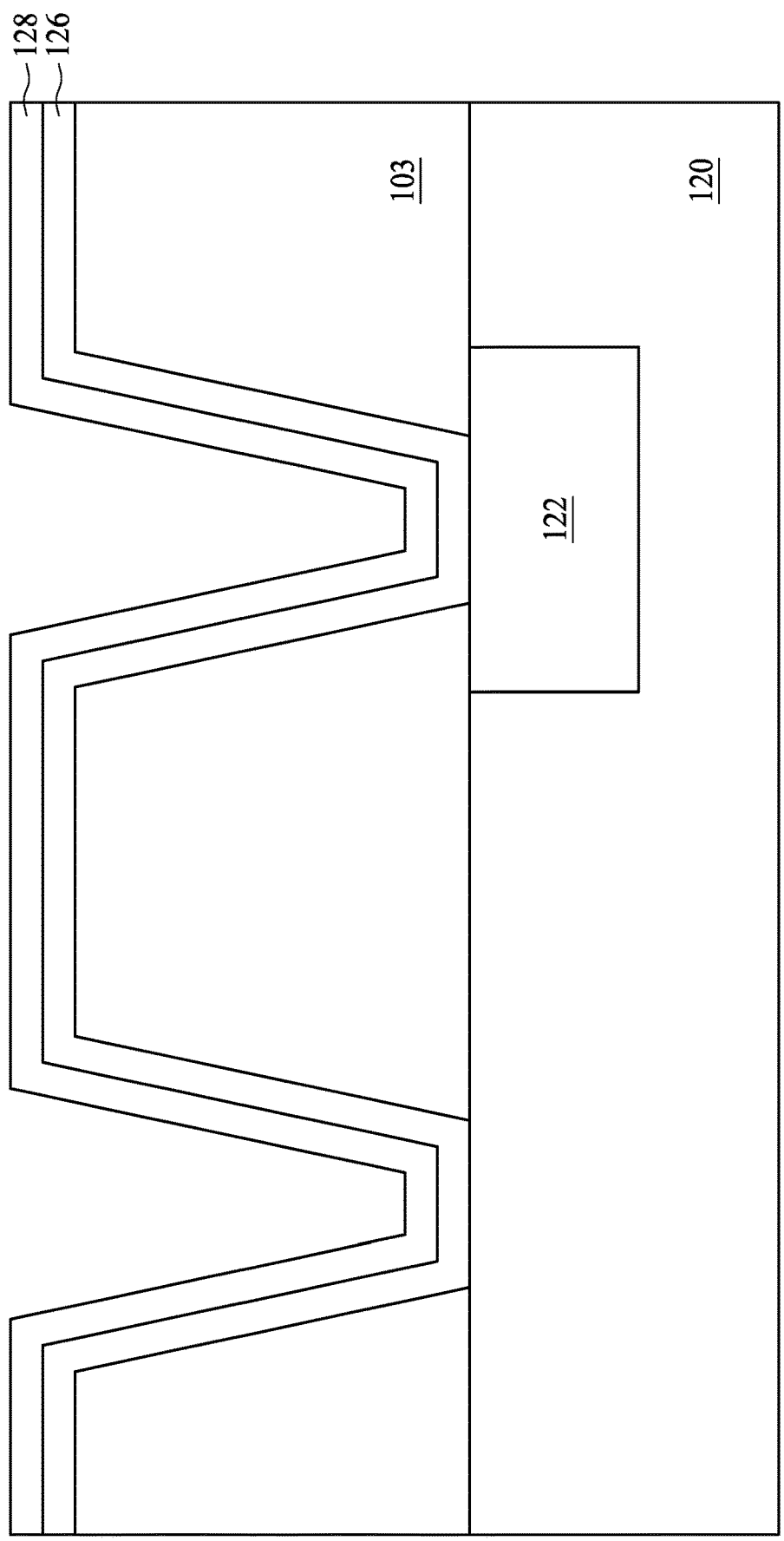

Referring to FIG. 5, in some embodiments, a seed layer 128 may be deposited on the barrier layer 126 to improve the quality of the electrode surface. In this way, high quality plating may be obtained for the copper to be deposited in the next step. In an exemplary deposition operation, argon (Ar) is first introduced to generate argon plasma. The positively charged argon ions are attracted to the negatively charged copper material, causing a bombardment. Copper ions are thus sputtered from the copper material, and deposited onto the barrier layer 126, forming the seed layer 128.

The seed layer 128 is a thin copper layer on the surface where a metal layer will be plated. The chemical vapor deposition (CVD) may be used to deposit the seed layer 128. Optionally, before the formation of the seed layer 128, the barrier layer 126 is pre-cleaned. The pre-cleaning greatly improves the surface texture of the barrier layer 126 so that the subsequently formed seed layer 128 may be more conformal.

Figure 6:
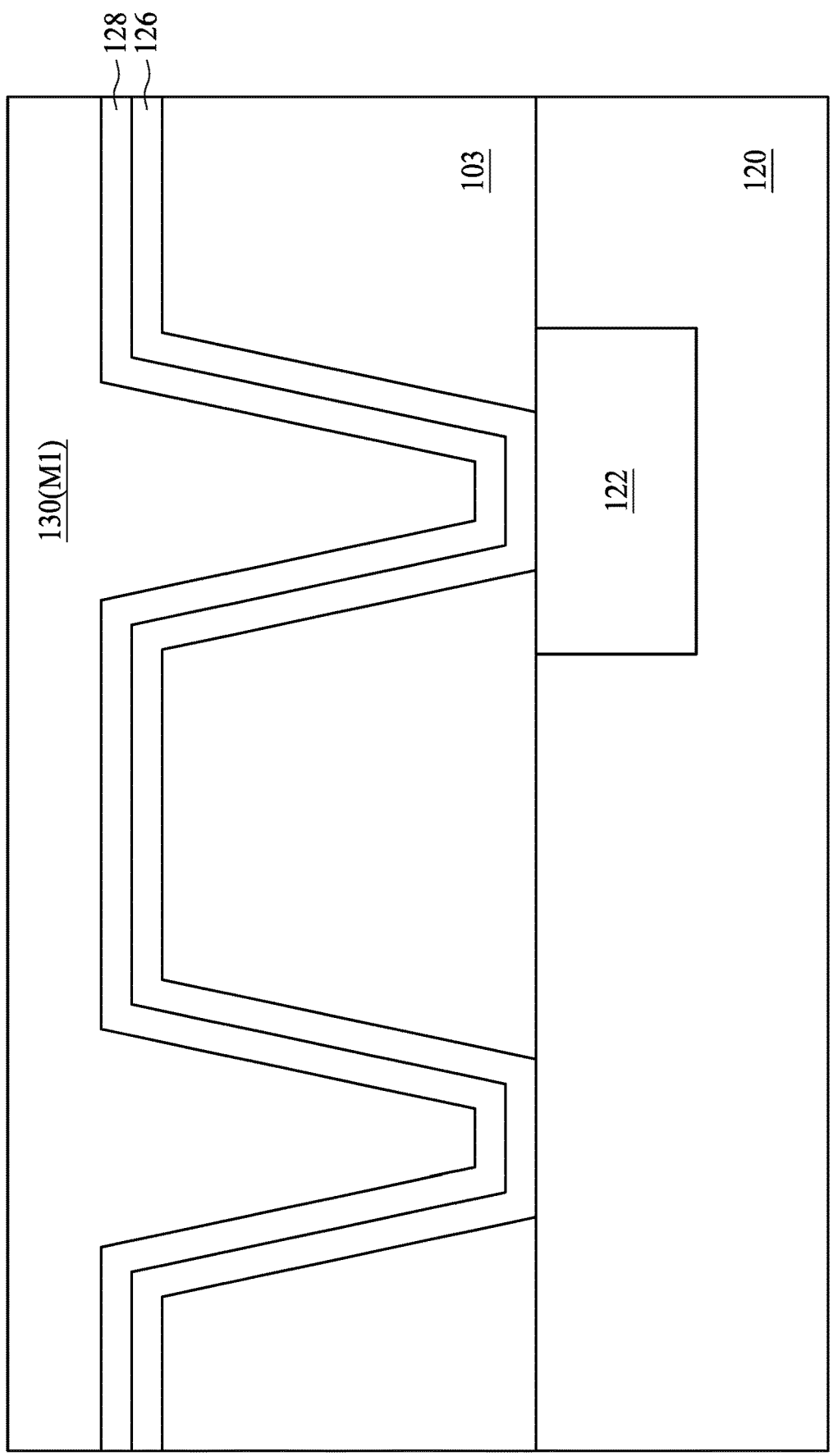

Referring to FIG. 6, a conductive material 130 (i.e., the first material M1), such as copper (Cu), may be disposed over the seed layer 128, into the via holes 124, to form the vias and the metal lines. Other material, such as tungsten (W), may also be used. The conductive material 130 may be formed by an electro-chemical plating process.

Referring to FIG. 7, a planarization operation, such as a CMP process, may be performed to expose the low-k or ELK dielectric layer 103. The first conductive pattern 104 and the dielectric layer 103 are together referred as the substrate 102. Although the figures show only one metallization layer for interconnecting the individual devices 122, there may be other layers form on the bottom layer 120 for other functions. The bottom layer 120, the individual devices 122, the barrier layer 126, and the seed layer 128 are omitted in the interest of brevity in the following figures.

Turning now to FIG. 8, FIG. 8 illustrates the substrate 102 formed through the damascene operation described above in relation to FIG. 3 to FIG. 7. The substrate 102 has the dielectric material 103 and the first conductive pattern 104 embedded in the dielectric material 103. The first conductive pattern 104 includes the first material M1.

Figure 9:
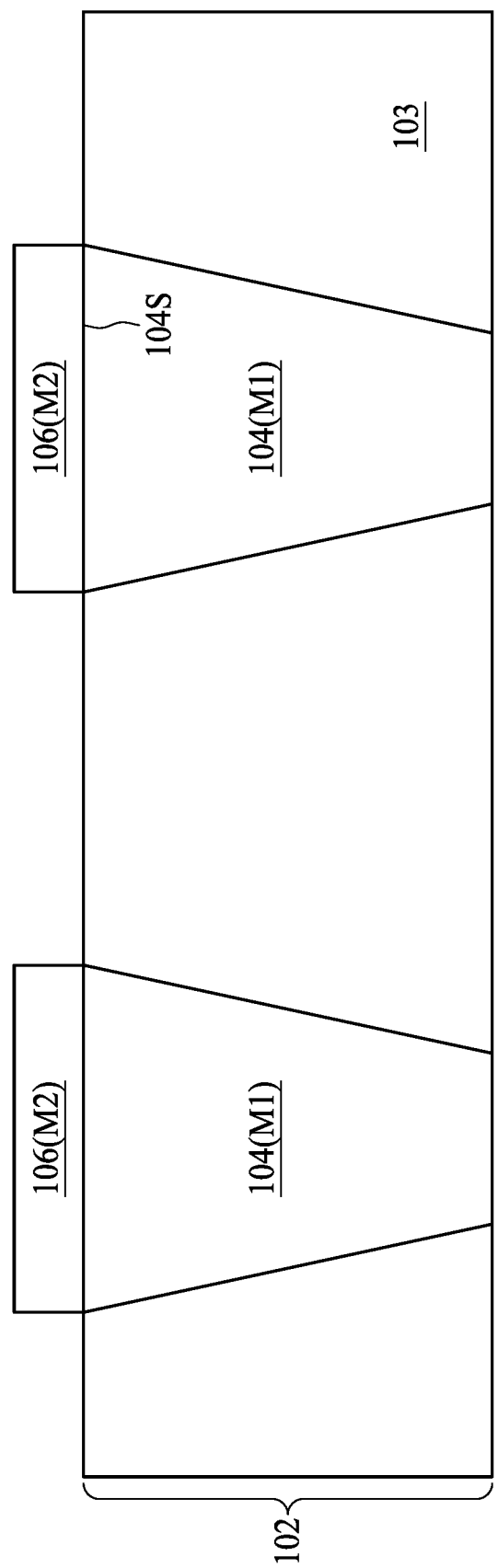

Referring to FIG. 9, the conductive mask 106 is formed on the exposed surface 104S of the first conductive pattern 104.

In some embodiments, the conductive mask 106 may be formed by technique such as metal-metal epitaxy on silicon (MMES), or other metal growth techniques, including sputtering and other thin film deposition techniques.

In some embodiments, the conductive mask 106 grows on the first conductive pattern 104 as epitaxial islands. It is known in the art that, the lattice constant is a measure of the structural compatibility between different materials in epitaxial growth. Lattice constant matching is important for the growth of materials on other materials. Metal grows easily on a surface with little lattice spacing difference.

In some embodiments, the first material M1 and the second material M2 may be predetermined or be under control so that the second material M2 only grows on the first material M1, but not grows on the dielectric material 103. In an example where the first material M1 is copper, cobalt or nickel may grow on the copper with little lattice spacing difference.

Certain metals do not exhibit a lattice match with copper. Such metals require one or more additional metal seed layers before epitaxial growth is achieved. For example, gold (Au), silver (Ag), platinum (Pt), iron (Fe), vanadium (V) and chromium (Cr) will grow epitaxially when palladium (Pd) is first deposited on copper. Tungsten (W) and molybdenum (Mo), for instance, do not grow epitaxially on palladium but will grow epitaxially when gold (Au) is first deposited on palladium. In such embodiment, the conductive mask 106 may be a composite film.

Figure 10:
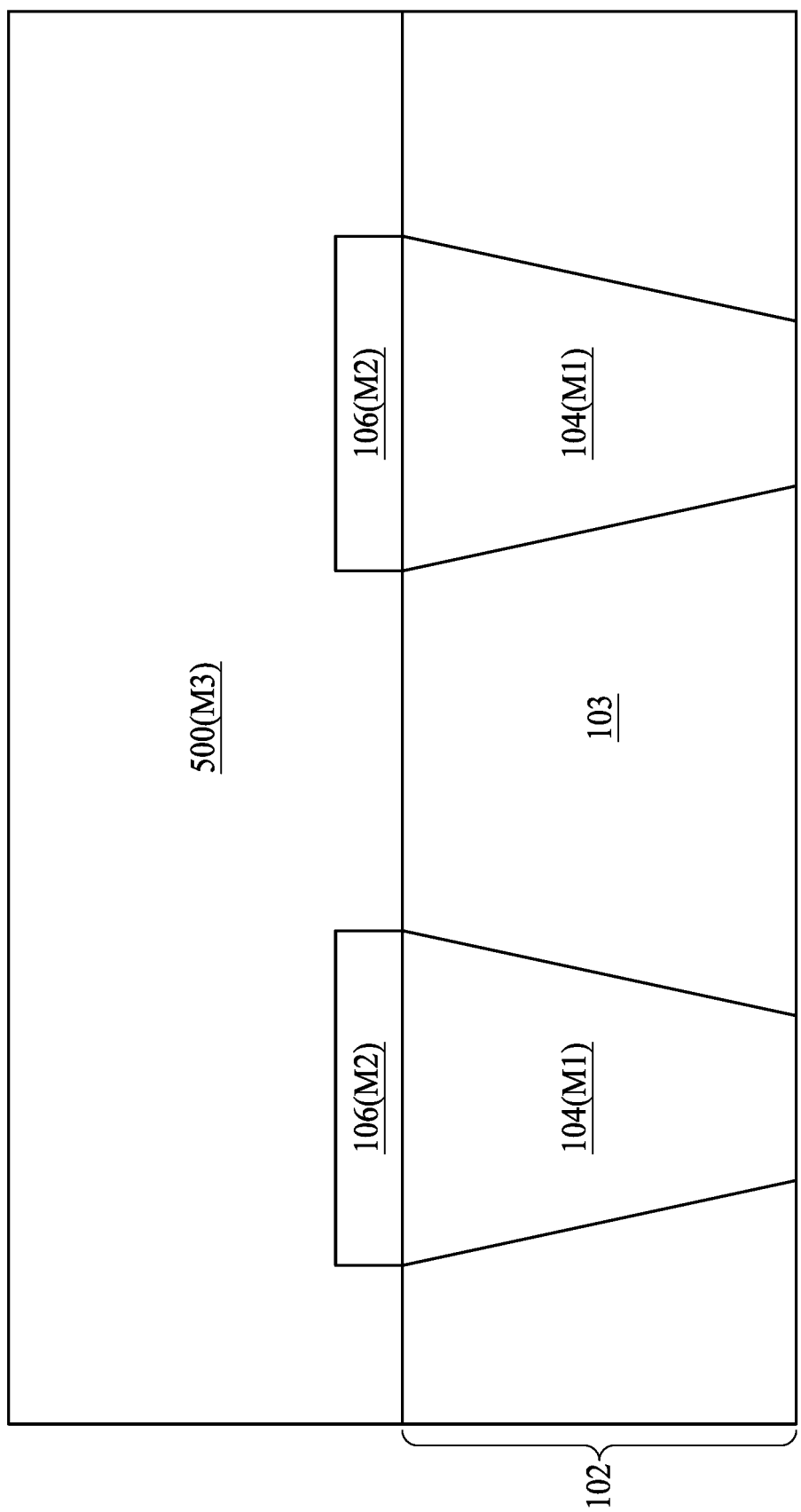

Referring to FIG. 10, a blanket metal layer 500 is deposited over the substrate 102 and the conductive mask 106. In some embodiments, the blanket metal layer 500 includes copper (Cu), cobalt (Co), aluminum (Al), titanium (Ti), ruthenium (Ru), tungsten (W), rhodium (Rh), molybdenum (Mo), or other suitable metal or alloy thereof. The blanket metal layer 500 can be formed by any of several methods that are well known in the art, such as CVD, PVD, PECVD, PEPVD, ALD, spin coating, or sputtering.

Figure 11:
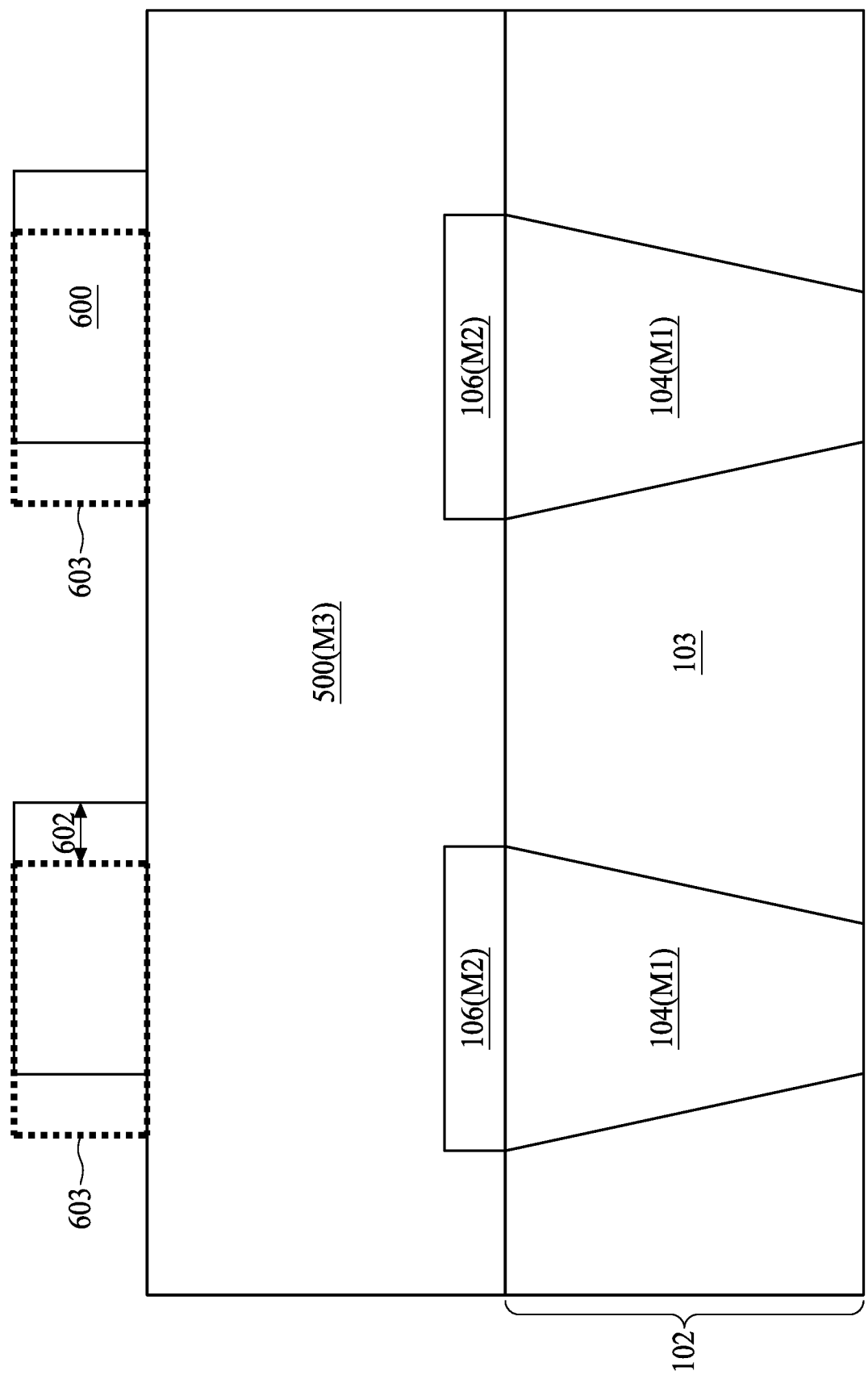

Referring to FIG. 11, a photo-sensitive polymer layer 600 is formed the blanket metal layer 500 to pattern the blanket metal layer 500. In some embodiments, the photo-sensitive polymer layer 600 includes photoresist materials including, but not limited to, positive photoresist materials and negative photoresist materials. In the illustrated example in FIG. 11, the photo-sensitive polymer layer 600 is formed from a positive photoresist material such as, but not limited to, a novolak positive photoresist material or a poly-methyl-meth-acrylate (PMMA) positive photoresist material. The photo-sensitive polymer layer 600 can be formed using any suitable technique, such as CVD, LPCVD or PECVD.

In some embodiments, as shown in FIG. 11, the photo-sensitive polymer layer 600 is patterned by using a standard method of photolithography. For example, the photo-sensitive polymer layer 600 is patterned by photoresist coating, exposure and development process. Then a portion of the blanket metal layer 500 is exposed from the photo-sensitive polymer 600.

In some embodiments, as shown in FIG. 11, the photo-sensitive polymer layer 600 is patterned with an offset 602 from the dashed line boxes 603. The dashed line boxes 603 are aligned with fringe of the conductive mask 106. In such way, the second conductive pattern 108 formed in the subsequent step will be aligned to the conductive mask 106 with the offset 602. In some embodiments, the second conductive pattern 108 is aligned to covers at least one corner of the conductive mask 106, such as the corner 110B.

In some embodiments, the second conductive pattern 108 is aligned to the conductive mask 106 with no offset, forming the semiconductor device 200 in FIG. 2.

Figure 12:
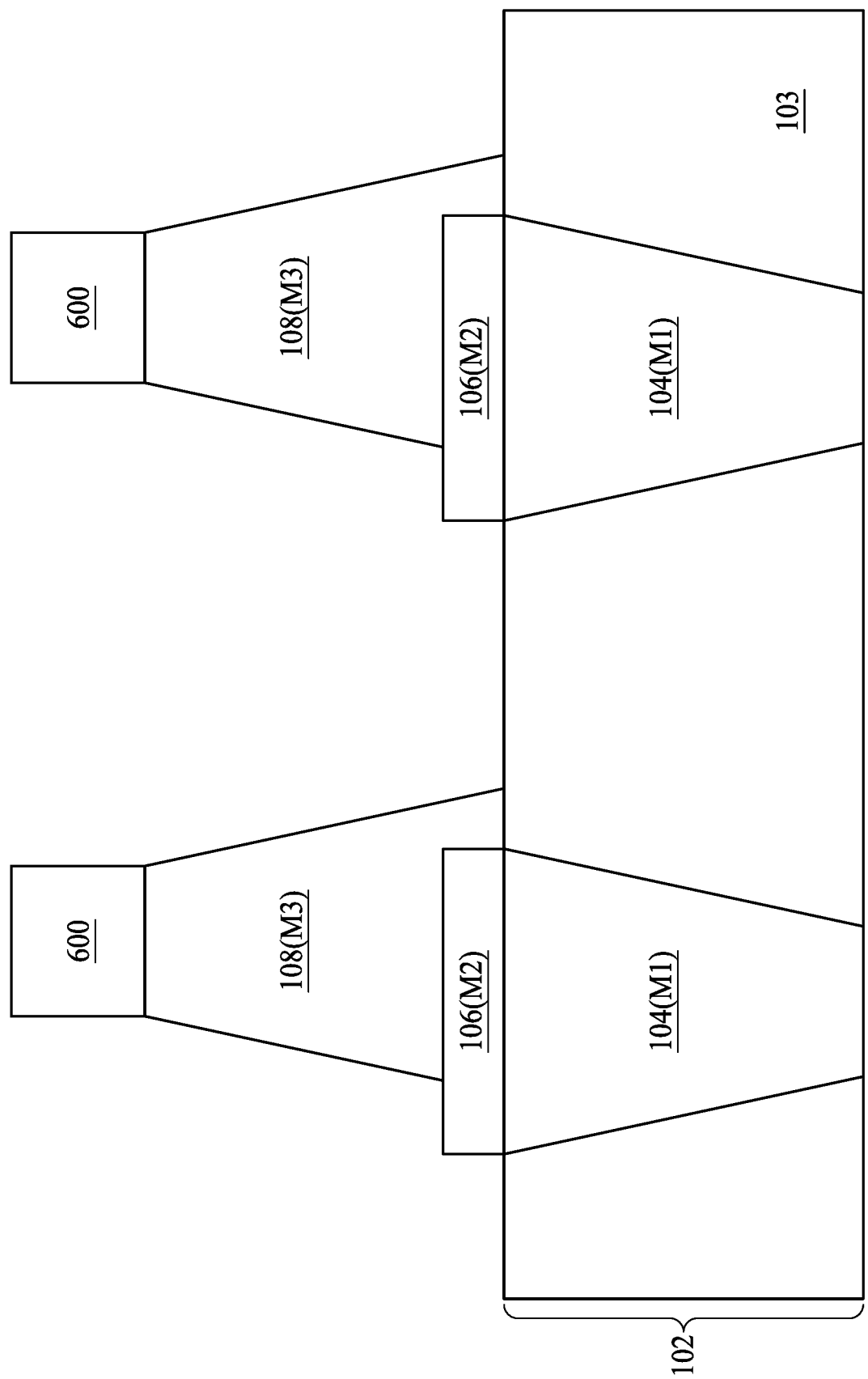

Referring to FIG. 12, the blanket metal layer 500 is etched, using the photo-sensitive polymer layer 600 as a mask. Since the photo-sensitive polymer layer 600 is a positive photoresist illustrated example, the exposed portions of the blanket metal layer 500 is etched away by the predetermined etchant. In an embodiment where the photo-sensitive polymer layer 600 is a negative photoresist, the alignment of the sensitive polymer layer 600 may also be deformed, and the covered portions of the blanket metal layer 500 is etched away.

In some embodiments, the predetermined etchant includes halogens. As mentioned above, the second conductive material M2 of the conductive mask 106 has a lower etch rate to the predetermined etchant than the third conductive material M3 of the second conductive pattern 108. In some embodiments, the conductive mask 106 has a lower etch rate to the predetermined etchant than the blanket metal layer 500. The second conductive pattern 108 is formed on the substrate 102 and the conductive mask 106, as shown in FIG. 12. The second conductive pattern 108 is formed with a tapered profile, with the top width being smaller than the respective bottom width. In other words, sidewalls of the second conductive pattern 108 are slanted, with the inner angles α being less than 90 degrees.

Figure 13:
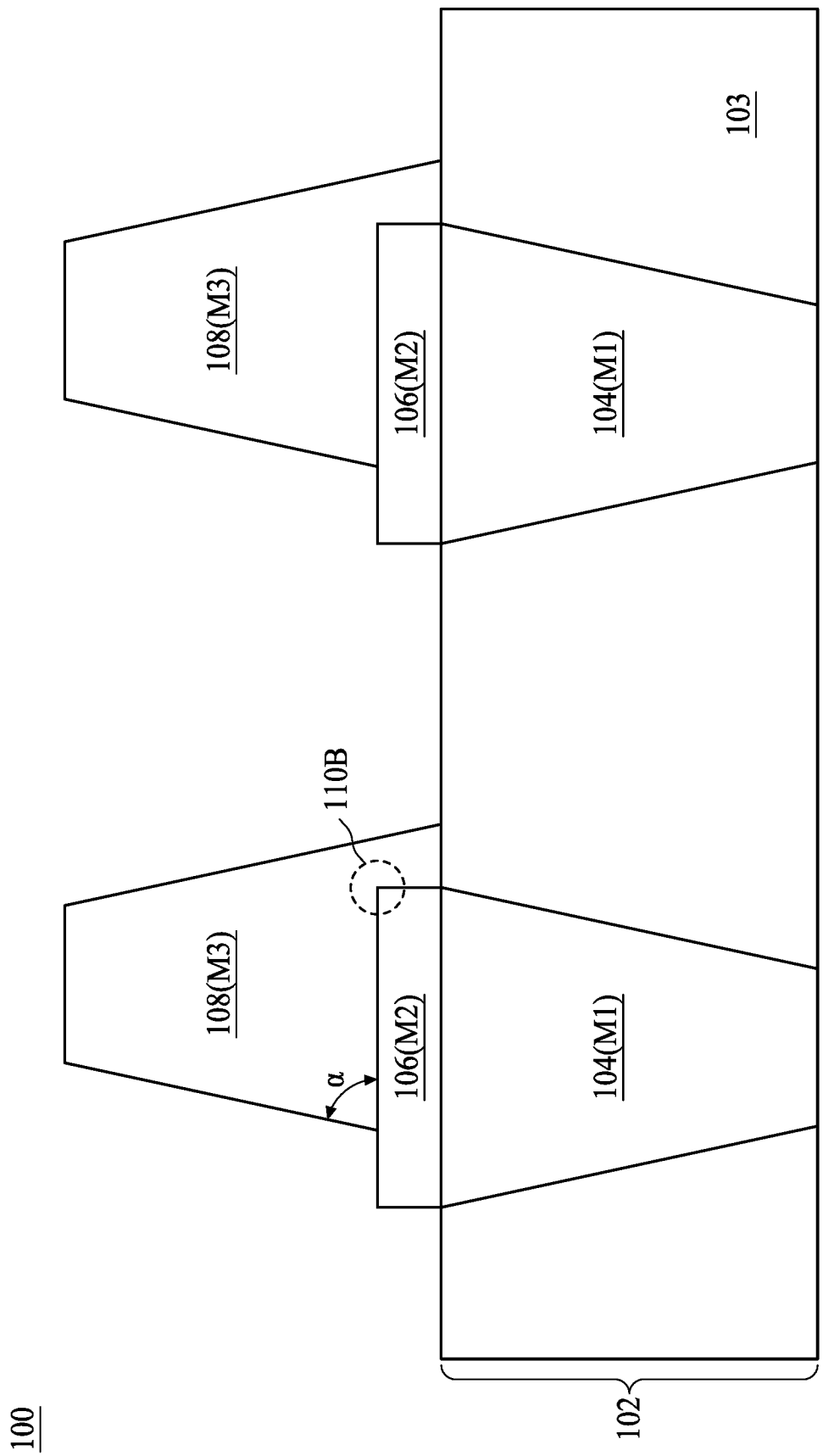

The sensitive polymer layer 600 may be stripped after transferring the pattern to the blanket metal layer 500, forming the semiconductor device 100 in FIG. 13.

Some embodiments of the present disclosure provide a semiconductor device. The semiconductor device includes a substrate having a first conductive pattern and a conductive mask disposed over the first conductive pattern. The first conductive pattern includes a first conductive material and the conductive mask includes a second conductive material. The semiconductor device further includes a second conductive pattern disposed over the conductive mask, and electrically connecting with the first conductive pattern through the conductive mask. The conductive mask has a lower etch rate to a predetermined etchant than the second conductive pattern. A method for forming the semiconductor device is also provided.

Some embodiments of the present disclosure provide a semiconductor device. The semiconductor device includes a substrate having a first conductive via, and a conductive mask disposed over the first conductive via. The semiconductor device further includes a second conductive via disposed over the conductive mask. The first conductive via has a first width gradually changed. The second conductive via has a second width gradually changed. The first width of the first conductive via and the second width of the second conductive via are gradually increase toward each other.

Some embodiments of the present disclosure provide a method for forming a semiconductor device. The method includes forming a substrate having a dielectric material and a first conductive pattern embedded in the dielectric material. The first conductive pattern includes a first conductive material. The method further includes forming a conductive mask over the first conductive pattern. The method further includes forming second conductive pattern over the conductive mask and electrically connecting with the first conductive pattern through the conductive mask, wherein the conductive mask has a lower etch rate to a predetermined etchant than the second conductive pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate having a first conductive pattern;
   a conductive mask disposed over the first conductive pattern; and
   a second conductive pattern, disposed over the conductive mask and electrically connecting with the first conductive pattern through the conductive mask;
   wherein a first width of the first conductive pattern and a second width of the second conductive pattern gradually increase toward each other, wherein the conductive mask comprises two corners from a cross-sectional view, and the second conductive pattern covers up at least one corner, and wherein the conductive mask includes a sidewall surface covered with the second conductive pattern.

2. The semiconductor device of claim 1, wherein the conductive mask comprises a composite film.

3. The semiconductor device of claim 1, wherein a material of the conductive mask comprises cobalt (Co) or nickel (Ni).

4. The semiconductor device of claim 1, wherein the first conductive pattern has a surface coplanar with a dielectric surface of the substrate.

5. The semiconductor device of claim 4, wherein the whole dielectric surface of the substrate is free from the conductive mask.

6. The semiconductor device of claim 4, wherein the second conductive pattern partially covers the dielectric surface of the substrate.

7. A semiconductor device, comprising:
   a substrate having a first conductive feature and a dielectric surface;
   a conductive mask disposed over the first conductive feature, the conductive mask includes a sidewall surface; and
   a second conductive feature disposed over the conductive mask,
   wherein the first width of the first conductive feature and the second width of the second conductive feature gradually increase toward each other, and the second conductive feature further covers a portion of the dielectric surface of the substrate, and wherein the substrate comprises a dielectric material and the first conductive feature is embedded in the dielectric material, and the whole dielectric material of the substrate is free from the conductive mask.

8. The semiconductor device of claim 7, wherein the second conductive feature further covers the sidewall surface of the conductive mask.

9. The semiconductor device of claim 7, further comprising a barrier layer between the first conductive feature and the dielectric material.

10. The semiconductor device of claim 9, further comprising a seed layer between the barrier layer and the first conductive feature.

11. The semiconductor device of claim 7, wherein the first conductive feature has a surface coplanar with the dielectric surface of the substrate.

12. The semiconductor device of claim 7, wherein the conductive mask comprises:
    a first surface contacting with the first conductive feature; and
    a second surface contacting with the second conductive feature.

13. The semiconductor device of claim 7, wherein a material of the conductive mask comprises cobalt (Co) or nickel (Ni).

14. A method for forming a semiconductor device, comprising:
    forming a substrate having a dielectric material and a first conductive pattern embedded in the dielectric material;
    forming a conductive mask over the first conductive pattern, wherein forming the conductive mask over the first conductive pattern comprises selectively forming the conductive mask over the first conductive pattern, and selectively forming the conductive mask over the first conductive pattern comprises metal-metal epitaxy on silicon (MMES);
    forming a second conductive pattern over the conductive mask and electrically connecting with the first conductive pattern through the conductive mask, wherein a first width of the first conductive pattern and a second width of the second conductive pattern gradually increase toward each other; and
    aligning the second conductive pattern to the conductive mask within an offset so that the second conductive pattern covers at least one corner of the conductive mask.

15. The method of claim 14, wherein the first conductive pattern tapers toward a first direction and the second conductive pattern tapers toward a second direction opposite to the first direction.

16. The method of claim 14, wherein forming the second conductive pattern comprises:
    forming a blanket metal layer on the substrate;

forming a photo-sensitive polymer layer over the blanket metal layer;

patterning the photo-sensitive polymer layer so that a portion of the blanket metal layer is exposed from the photo-sensitive polymer; and etching a portion of blanket metal layer.

17. The method of claim 16, wherein etching the portion of blanket metal layer comprises using an etchant having a lower etch rate to the conductive mask than the blanket metal layer.

18. The method of claim 14, wherein forming the first conductive pattern embedded in the dielectric material comprises:

forming a via hole in the dielectric material;

forming a conductive material in the via hole and on the dielectric material; and performing a planarization operation to expose the dielectric material and to form the first conductive pattern.

19. The method of claim 18, further comprising forming a barrier layer in the via hole prior to forming the conductive material.

20. The method of claim 19, further comprising forming a seed layer on the barrier layer prior to forming the conductive material.

* * * * *